United States Patent [19]
Ono

[11] Patent Number: 5,501,568
[45] Date of Patent: Mar. 26, 1996

[54] WAFER ALIGNING APPARATUS

[75] Inventor: Tosio Ono, Nishigoshi, Japan

[73] Assignee: Mitsubishi Denki Kabushiki Kaisha, Tokyo, Japan

[21] Appl. No.: 266,748

[22] Filed: Jun. 28, 1994

[30] Foreign Application Priority Data

Jul. 1, 1993 [JP] Japan .................................. 5-163656

[51] Int. Cl.$^6$ .................................................. B65G 65/02
[52] U.S. Cl. ........................... 414/417; 414/404; 414/938
[58] Field of Search .................................. 414/404, 416, 414/417, 750, 782, 936, 938

[56] References Cited

U.S. PATENT DOCUMENTS

| | | | |
|---|---|---|---|
| 4,108,323 | 8/1978 | Shambelan et al. | 414/417 |
| 4,573,851 | 3/1986 | Butler | 414/417 X |
| 4,597,819 | 7/1986 | Kusuhara et al. | 414/417 X |
| 4,695,217 | 9/1987 | Lau | 414/417 X |
| 4,856,957 | 8/1989 | Lau et al. | 414/938 X |
| 4,957,406 | 9/1990 | Akagawa | 414/416 |
| 4,958,982 | 9/1990 | Champet et al. | 414/404 X |
| 5,007,788 | 4/1991 | Asano et al. | 414/417 |
| 5,188,499 | 2/1993 | Tarng et al. | 414/416 X |

FOREIGN PATENT DOCUMENTS

| | | | |
|---|---|---|---|
| 3079341 | 4/1988 | Japan | 414/938 |
| 3084043 | 4/1988 | Japan | 414/938 |
| 1048442 | 2/1989 | Japan | 414/938 |
| 1255242 | 10/1989 | Japan | 414/938 |
| 2169408 | 6/1990 | Japan | 414/938 |
| 3273662 | 12/1991 | Japan | 414/938 |

Primary Examiner—Michael S. Huppert
Assistant Examiner—James W. Keenan
Attorney, Agent, or Firm—Leydig, Voit & Mayer

[57] ABSTRACT

A wafer aligning apparatus for re-aligning a plurality of wafers at different pitches. The apparatus includes a plurality of wafer retaining plates, each of which retains a plurality of wafers, a guide device which guides the wafer retaining plates, and a transferring device which transfers the wafer retaining plates along the guide device, wherein when the plurality of wafer retaining plates are at one end of the guide device, they are spaced at a first pitch and aligned, and when the wafer retaining plates are at the other end of the guide device, they are aligned at a second pitch different from the first pitch.

20 Claims, 10 Drawing Sheets

WAFER ALIGNING APPARATUS

BACKGROUND OF THE INVENTION

1. Field of the Invention

The present invention relates to a wafer aligning apparatus for aligning a plurality of wafers, and, in particular, to a wafer aligning apparatus which is capable of re-aligning a plurality of wafers at different pitches.

2. Description of the Related Art

Hitherto, semiconductor wafers have been coated, for example, by oxide film deposition at high temperature, in the following way.

As illustrated in FIG. 11, 25 wafers 2 are accommodated, for example, in a cassette 1. Here, the wafers 2 are accommodated at the same pitch, with their surfaces 2a each facing the same direction. The worker holds the cassette 1 in his hand, contacts a vacuum tweezer 3 to the back side 2b of one wafer 2, which results in the back side being grasped and retained. With the wafer 2 placed on an aligning boat 4, the vacuum tweezer 3 is moved away from the wafer 2. In this way, the twenty-five wafers 2, accommodated in the cassette 1, are transferred, one at a time, to the aligning boat 4. After all the wafers 2 are transferred, the aligning boat 4 is moved to a film forming apparatus 5, where the wafers 2 come into contact with a reacting gas at a high temperature, which forms a film on the wafers 2.

After the coating, the aligning boat 4 is drawn out of the film forming apparatus 5 for the wafers 2 to cool naturally. Then, the worker uses the vacuum tweezer again to pull out, one at a time, the wafers 2 from the aligning boat 4, and transfers them into the cassette 1.

As shown in FIG. 12, the reacting gas is supplied to the film forming apparatus 5 from an inlet 5a. After coming into contact and reacting with the surface of each of the wafers 2 placed on the aligning boat 4 in a tubular film forming apparatus body 5b, the gas is discharged from an outlet 5c. Here, the adjacent wafers 2 must be spaced at an interval greater than a predetermined interval to make uniform the density of the reacting gas which comes into contact with each of the surfaces of the wafers 2. That is, when the adjacent wafers 2 are not sufficiently spaced apart, the reacting gas cannot flow smoothly between these wafers, thus making it difficult to make uniform the coating on each of the wafers 2 throughout its surface.

When each of the wafers 2 is spaced further apart and aligned, the coating capability of the film forming apparatus is reduced because of a reduced number of wafers 2 which can be accommodated therein.

As illustrated in FIG. 12, measures have been taken, conventionally, to counter this problem by aligning the wafers 2 such that each of the adjacent wafers face each other, with pitch P1 set, for example, at about 9.52 mm, when the surfaces 2a of each of the adjacent wafers 2 face each other, on the one hand, and pitch P2 set, for example, at ½ the pitch of P1 (4.76 mm), when the back surfaces 2b thereof face each other, on the other. This prevents reduced coating performance of the film forming apparatus 5 from occurring because the reacting gas flows smoothly at each of the surfaces 2a of the wafers 2 which results in uniform coating, and the film forming apparatus body 5b is able to accommodate a large number of wafers 2.

However, in the aligning method illustrated in FIG. 12, when the worker transfers the wafers 2 from the cassette 1 to the aligning boat 4, and vice versa, he must take out the wafers 2, one by one, with the vacuum tweezer 3, and place the wafers 2 such that they alternatingly face opposite each other, in the cassette 1. This requires much time and effort, and may give rise to scratched wafers 2 by the use of the vacuum tweezer 3, and the possibility of wafers 2 having foreign substances adhered thereto.

SUMMARY OF THE INVENTION

The present invention intends to overcome such problems by providing a wafer aligning apparatus which is capable of easily aligning a plurality of wafers, without scratching the wafers or introducing foreign substances thereto.

The wafer aligning apparatus of the present invention comprises a plurality of wafer retaining plates, each of which retains a plurality of wafers, guide means for guiding the wafer retaining plates, and transferring means for transferring the wafer retaining plates along the guide means, wherein when the plurality of wafer retaining plates are at one end of the guide means, they are spaced at a first pitch and aligned and when the wafer retaining plates are at the other end of the guide means, they are aligned at a second pitch different from the first pitch.

DESCRIPTION OF THE PREFERRED EMBODIMENT

An embodiment of the present invention is described below with reference to the attached drawings.

Figure 1:
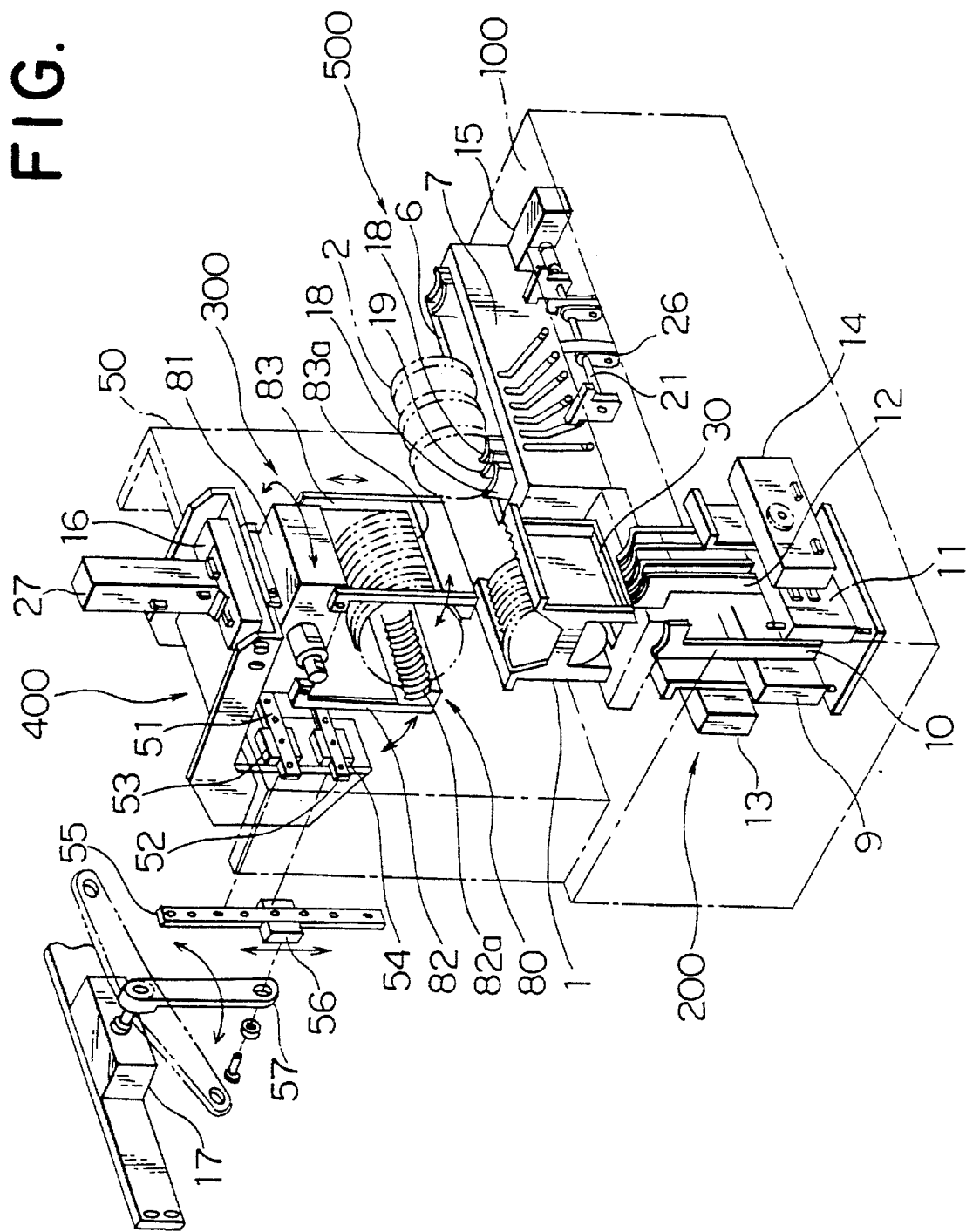
FIG. 1 is a perspective view of a wafer aligning apparatus related to an embodiment of the present invention.

Referring to FIG. 1, a cassette table 30 for placing a cassette 1 is formed on a base 100 of the aligning apparatus, and a wafer thrust-up section 200 is located below the cassette table 30, and a clamp section 300 is located above the table 30. The clamp section 300 is linked to a clamp transferring section 400. In the same Figure, an expand section 500 is provided on the base 100 and in the vicinity of the cassette table 30. The cassette 1 placed on the cassette table 30 is capable of accommodating, for example, twenty-five 5-inch wafers 2 at a pitch P3 (4.76 mm).

Figure 2:
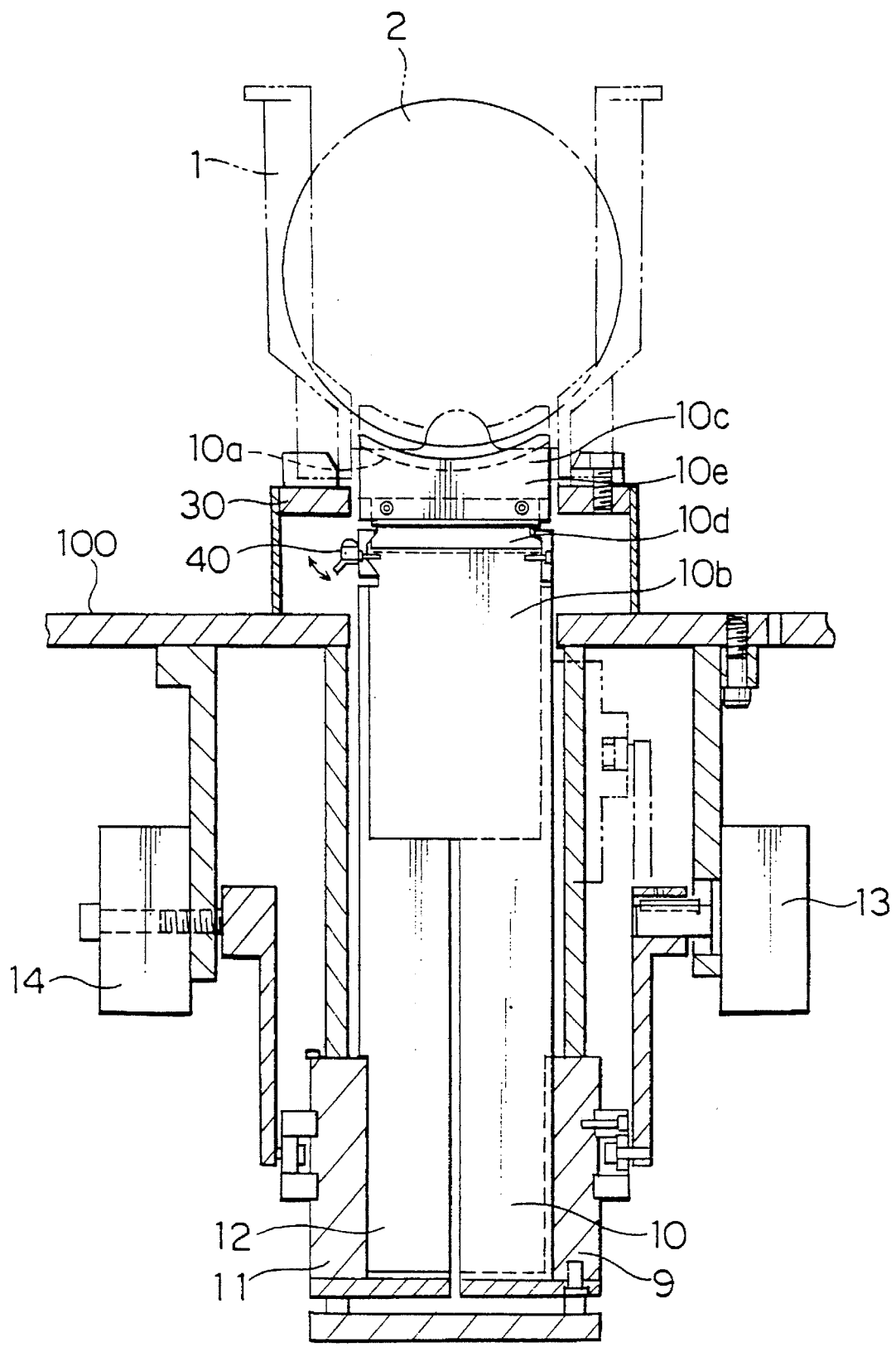
FIG. 2 is a diagram showing a wafer thrust-up section of an embodiment of the invention.
Figure 3:
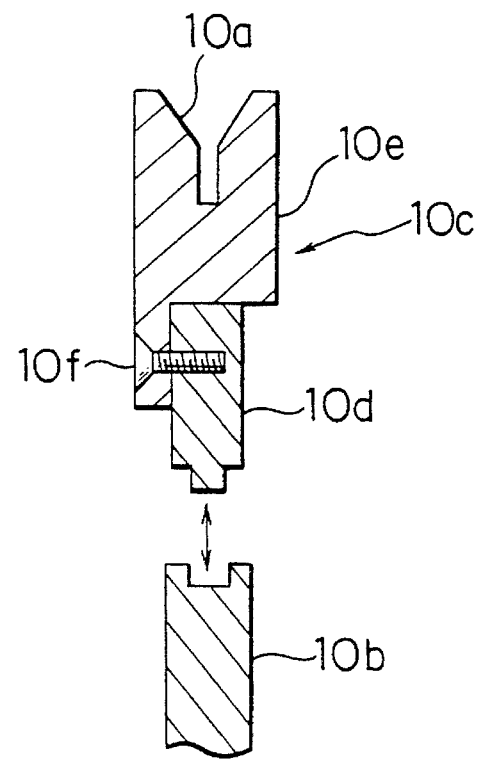
FIG. 3 is cross section of the upper end portion of a wafer thrust-up plate.

The wafer thrust-up section 200 thrusts up a plurality of wafers 2 above the cassette 1, which wafers are accommodated in the cassette 1, the cassette 1 being placed on the cassette table 30. As shown in FIG. 2 the thrust-up section 200 comprises first thrust-up plates 10 containing thirteen thrust-up plates alternatingly disposed, and second thrust-up plates 12 containing twelve thrust-up plates alternately disposed. The thrust-up plates 10 and 12 are aligned at the same pitch as are the wafers 2 accommodated in the cassette 1, namely, at the pitch P3. The first thrust-up plates 10 correspond to the odd-numbered wafers of the twenty-five wafers 2, and the second thrust-up plates 12 to the even-numbered wafers. The first thrust-up plates 10 are retained by a first vertically moving plate 9 which is vertically movably by means of a first rotary actuator 13. On the other hand, the second thrust-up plates 12 are retained by a second vertically moving plate 11 which is vertically movably by means of a second rotary actuator 14. Such grooves as 10a, shown in FIG. 3, are formed in the upper ends of the thrust-up plates 10 and 12. When the thrust-up plates 10 and 12 move upward, the peripheries of the wafers 2 accommodated in the cassette 1 are inserted in the appropriate grooves in the upper ends of the thrust-up plates, so that the wafers 2 are held by thrust-up plates 10 and 12 and thrusted above the cassette 1. As shown in FIG. 3, which illustrates the upper end portion of one of the thrust-up plates 10, each of thrust-up plates 10 includes a thrust-up body 10b and a thrust-up block 10c provided at the upper end of the thrust-up plate body 10b. The thrust-up block 10c includes a lower portion 10d and an upper portion 10e in which the groove 10a for retaining a wafer is formed. The upper and lower portions 10d and 10e are connected to each other by a screw 10f. As shown in FIG. 2, the thrust-up block 10c can be removably attached to the thrust-up body 10b by a lock lever 40. Thrust-up plates 12 are similarly constructed.

The first and second rotary actuators 13 and 14 are driven separately, so that either the thirteen odd-numbered, or the twelve even-numbered wafers, or all twenty-five of the wafers 2 in the cassette 1, may be thrusted upward.

As shown in FIG. 1, the clamp section 300 comprises a chuck 80 for gripping the plurality of wafers 2, and a drive section 81 for opening and closing the chuck 80. The chuck 80 has a pair of arms 82 and 83, whose front ends have, respectively, twenty-five grooves 82a and 83a formed therein, which are spaced at the pitch P3. These grooves 82a and 83a are the same shape as the grooves of the respective thrust-up plates 10 and 12, shown in FIG. 3. Accordingly, inserting the peripheries of the wafers 2 into the grooves 82a and 83a and closing the chuck 80 with the drive section 81 grips the twenty-five wafers 2 at the same time.

The driving section 81 of the clamp section 300 is held by the clamp transferring section 400. The clamp section 300 has a rotary actuator 16 for rotating the clamp section 300 around the perpendicular shaft, a vertically moving cylinder for vertically moving the clamp section 300, and a rotary actuator 17 for horizontally moving the clamp section 300. A wall 50 is perpendicular to the upper surface of the base 100, where two rails 51 and 52 are provided horizontally and parallel to each other. The rails 51 and 52 are each fitted between sliding bearings 53 and 54, and a rail 55 is fixed perpendicular to the sliding bearings 53 and 54. The rail 55 is, further, fitted between sliding bearings 56, both rail and sliding bearings being attached to the front end of an arm 57 which is rotated by a rotary actuator 17.

The clamp transferring section 400 having such an arrangement allows the clamp section 300 to rotate around the perpendicular shaft, and move vertically and horizontally, while gripping the wafers 2.

The expand section 500 is located on the base 100 and adjacent to the cassette table 30. It has seven first wafer retaining plates 18 and six second wafer retaining plates 19, which are alternatingly arranged. The first wafer retaining plates 18 are each slidably retained in a first plate cam 6, and the second wafer retaining plates 19 are each slidably retained in a second plate cam 7. The first and second wafer retaining plates 18 and 19 move vertically by being driven by a rotary actuator 15 via a rotating shaft 21 and arms 26.

Figure 4:
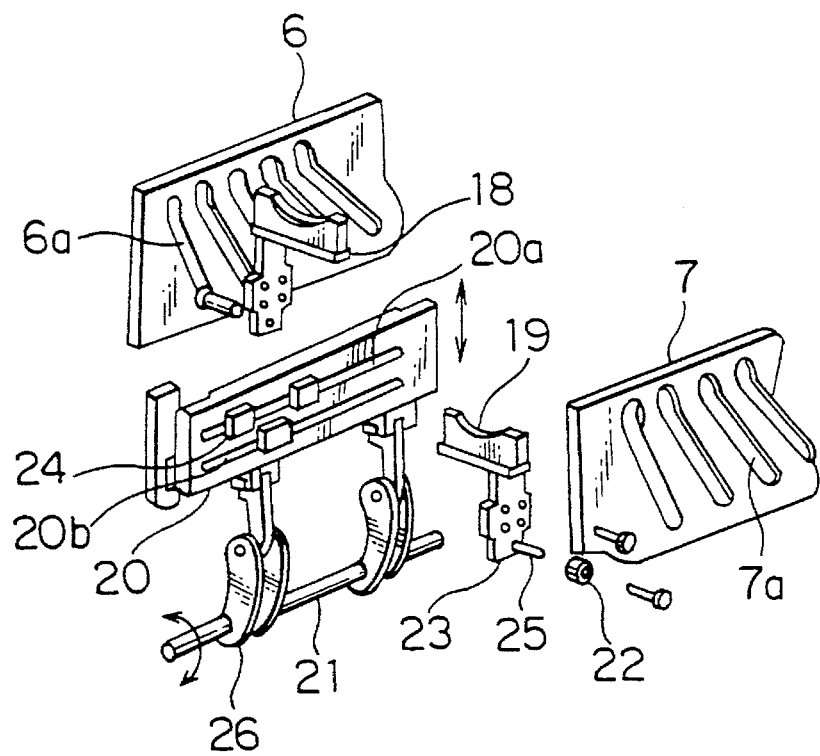
FIG. 4 is an exploded view of a portion of an expand section of an embodiment of the invention.
Figure 5:
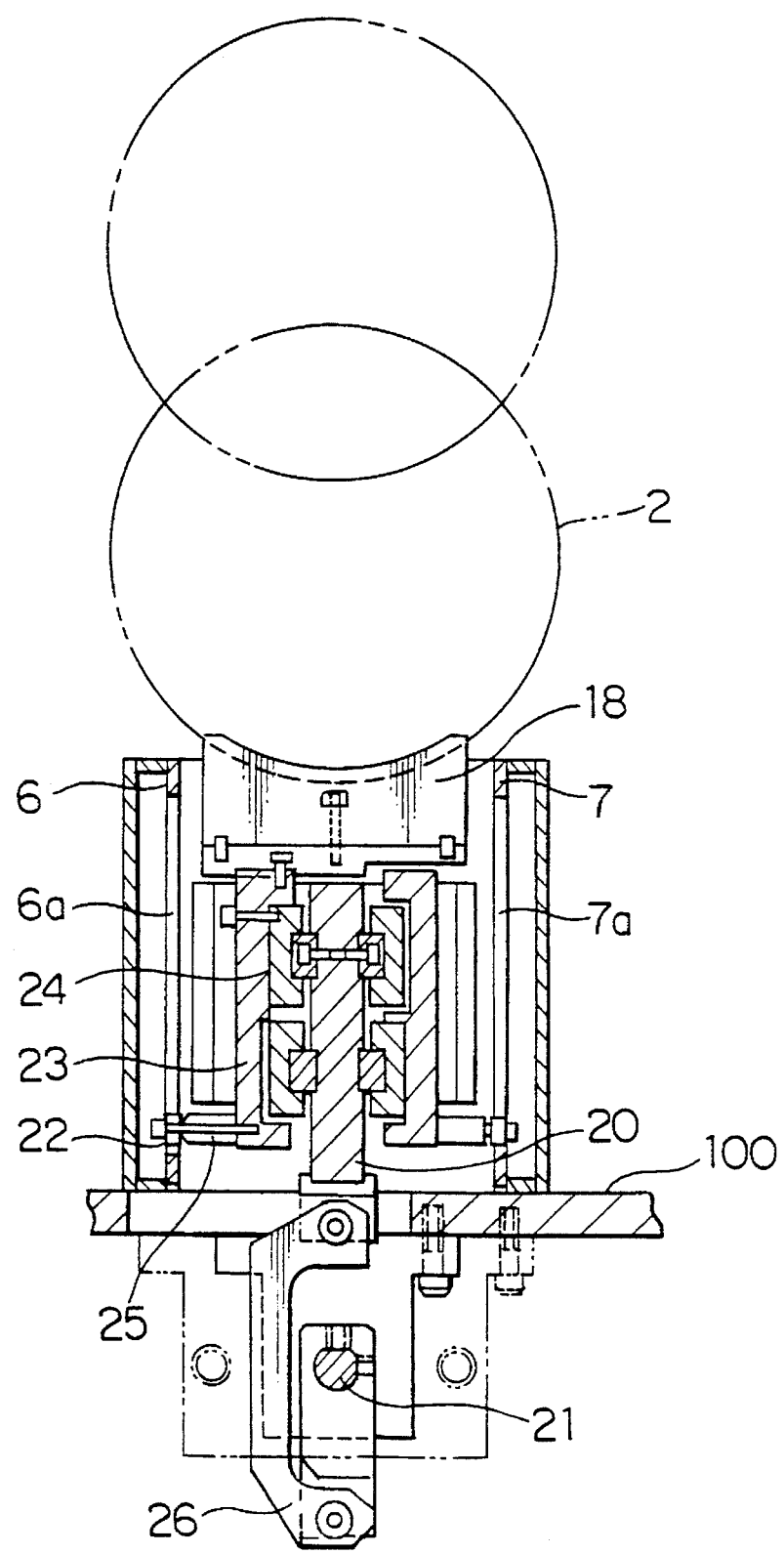
FIGS. 5 and 6 are, respectively, side and front views of the expand section.

As shown in FIGS. 4 and 5, the rotating shaft 21 is secured by arms 26, and a vertically moving plate 20 is fixed to the arms 26. The vertically moving plate 20 is provided with two grooves 20a and 20b which extend horizontally and parallel to each other. These grooves 20a and 20b are provided with a plurality of sliding bearings 24 which correspond respectively to wafer retaining plates 18 and 19. The wafer retaining plates 18 and 19 are each retained on the sliding bearings 24 by means of a mounting plate 23. The mounting plate 23 is provided with a rod 25 which projects outward opposite to the vertically moving plate 20, with the end portion of the rod 25 provided with bearing 22. The bearing 22, which corresponds to the first wafer retaining plate 18, is slidably fitted into a guiding slot 6a formed in the first plate cam 6; and the the bearing 22 which corresponds to the second wafer retaining plate 19 is slidably fitted into a guide slot 7a in the second plate cam 7.

Figure 6:
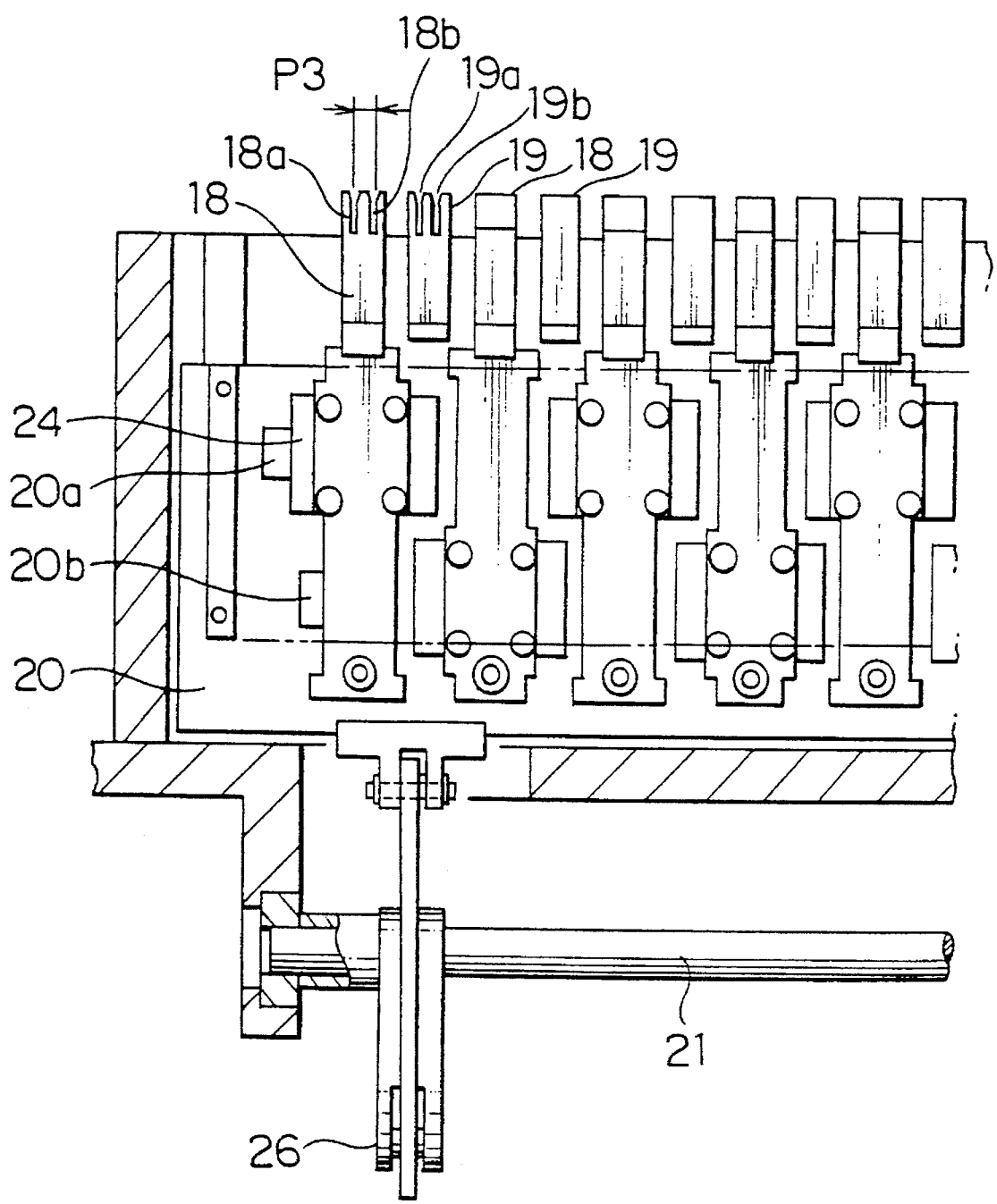

As shown in FIG. 6, a pair of grooves 18a and 18b are formed in the upper end of the first wafer retaining plate 18 to retain two wafers 2. These grooves 18a and 18b are formed at the same pitch, P3, as the plurality of grooves 82a and 83a in the chuck 80 of the clamp portion 300. In the same way, a pair of grooves 19a and 19b are formed in the upper end of the second wafer retaining plate 19 at the pitch P3. In FIG. 6, although grooves for only one of the plurality of the wafer retaining plates 18 and 19 are shown for simplicity, grooves 18a and 18b, and 19a and 19b are formed in the same way in all of the wafer retaining plates 18 and 19.

Figure 7:
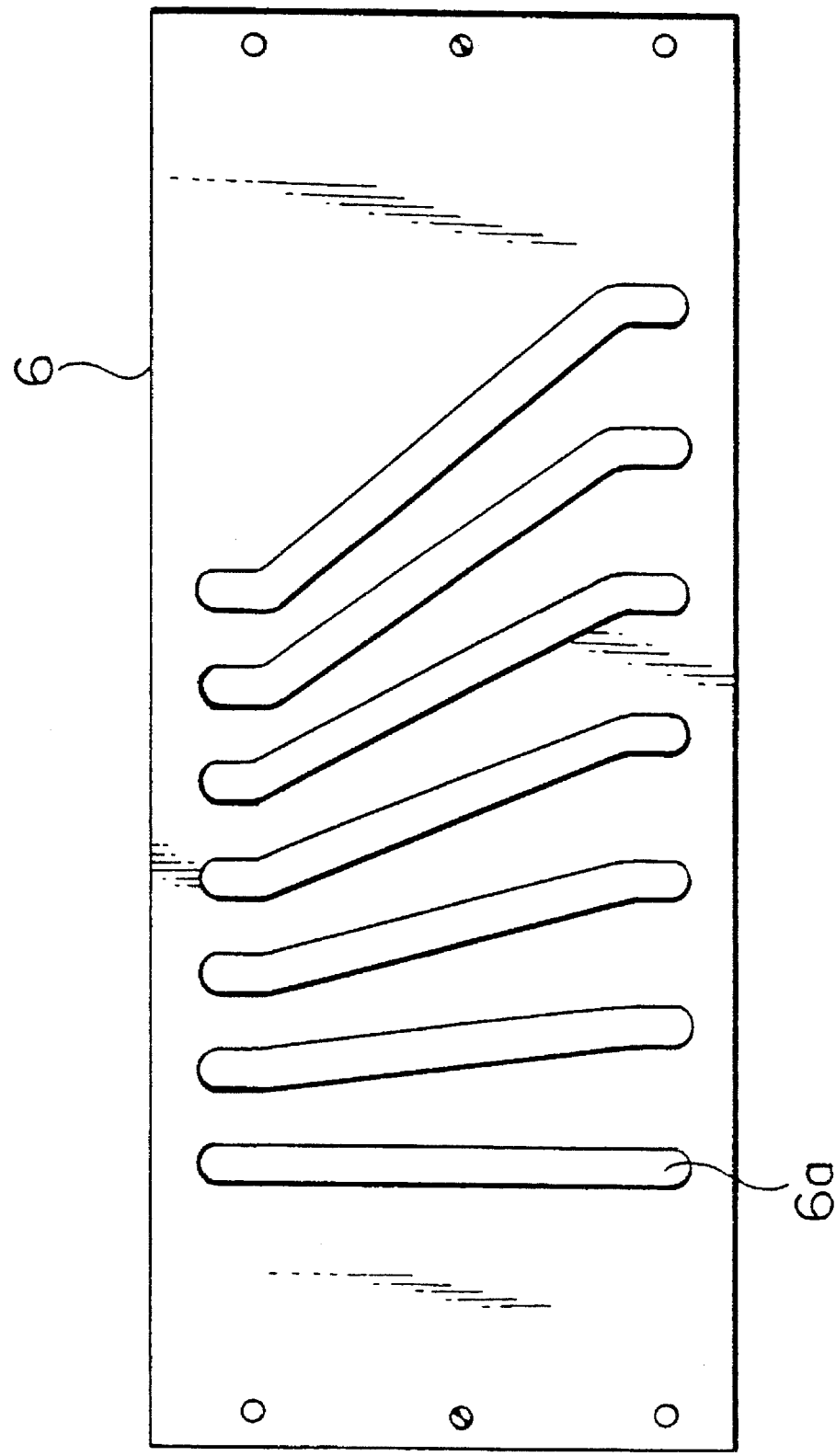
FIG. 7 illustrates a plate cam of the expand section.

FIG. 7 is a plan view of the first plate cam 6. Seven guide slots 6a in the first plate cam 6 correspond respectively to the seven first wafer retaining plates 18. The distance between adjacent guide slots 6a is smaller at the upper portion thereof, and larger at the lower portion thereof. Though not illustrated, six guide slots 7a of the same shape are also formed in the second plate cam 7 in the same way. The first and second plate cams 6 and 7 allow the first and second wafer retaining plates 18 and 19 to move upward based on the operation of a rotary actuator 15, so that the distance between the wafer retaining plates 18 and 19 gradually becomes smaller in correspondence with the shapes of the guide slots 6a and 7a in the plate cams 6 and 7. On the other hand, moving the wafer retaining plates 18 and 19 causes the distance between these wafer retaining plates 18 and 19 to gradually widen.

Figure 8:
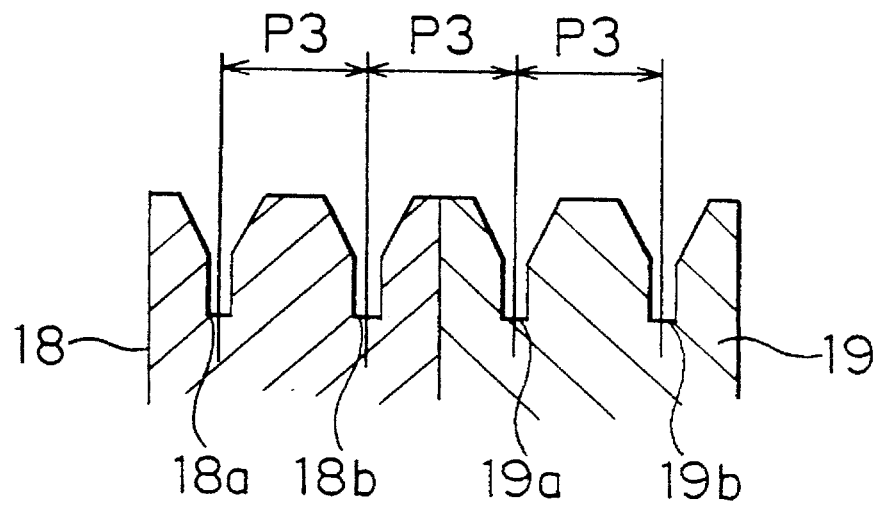
FIGS. 8 and 9 each illustrate, respectively, the upper end portion of the wafer plate during normal conditions, and its expand portion during expansion.
Figure 9:
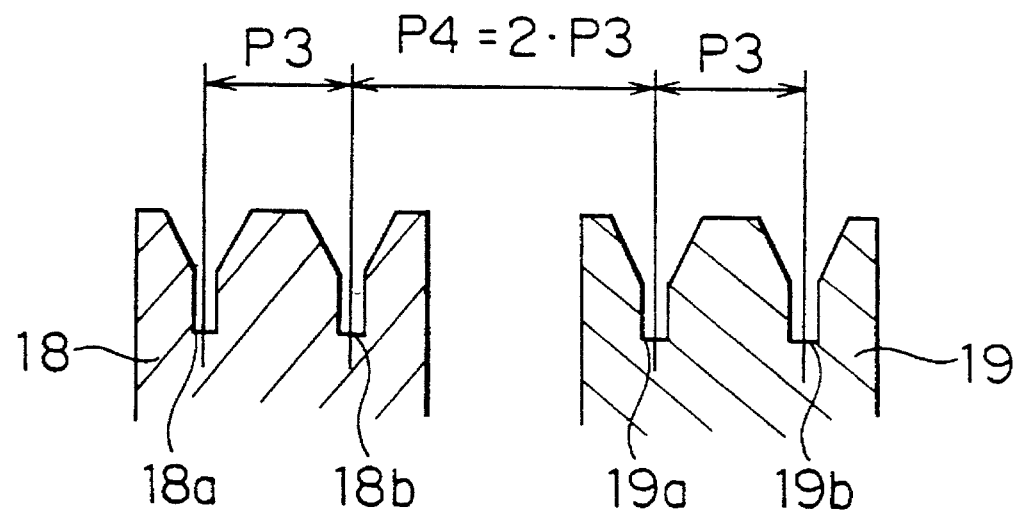

In the embodiment, the guide slots 6a and 7a meet the following conditions. As shown in FIG. 8, when the wafer retaining plates 18 and 19 are moved upward to the uppermost portion, the distance between the groove 18b of the first wafer retaining plate 18 and the groove 19a of the adjacent second wafer retaining plate 19 is the same pitch, P3, as that between the pair of grooves 18a and 18b of each of the wafer retaining plates 18, and the pair of grooves 19a and 19b of each of the wafer retaining plates 19. On the other hand, as shown in FIG. 9, when the wafer retaining plates 18 and 19 are moved downward to the lowermost portion, the distance between the groove 18b of the first wafer retaining plate 18 and the groove 19a of the second adjacent wafer retaining plate 19 is P4 or 9.52 mm, which is twice the pitch P3.

Next, the operation of the embodiment is described below. First, the cassette 1 which accommodates the twenty-five wafers 2 is placed on the cassette table 30. Turning on a start switch (not illustrated) causes the second rotary actuator 14 to rotate and the twelve second thrust-up plates 12, retained by the vertically moving plate 11, to move upward so that only the even-numbered wafers 2 of the wafers 2, which are accommodated in the cassette 1, are thrusted above the cassette 1.

The drive section 81 of the clamp section 300 opens the chuck 80. The chuck is moved downward to where the even-numbered wafers 2 have been thrusted up above the cassette 1 by means of the vertically moving cylinder 27 of the clamp transferring section 400. The operation of the drive section 81 closes the chuck 80, so that the even-numbered wafers 2 are gripped by the chuck 80. Gripping the even-numbered wafers 2, the chuck 80 moves upward with the drive section 81, after which the rotary actuator 16 of the clamp transferring section 400 operates to cause the chuck 80 to rotate 180 degrees around the vertical axis. This means that there is reversal of the front and back sides of the even-numbered wafers 2, which are gripped by the chuck 80. Then, the chuck 80 is moved downward by the vertically moving cylinder 27, and opened by the drive section 81. The wafers 2, whose front and back sides have been reversed, are held again above the cassette 1 by the second thrust-up plates 12.

Then, the first rotary actuator 13 rotates to cause the thirteen first thrust-up plates 10, which are retained by the vertically moving plate 9, to move upward, and the odd-numbered wafers 2, remaining in the cassette 1, are thrusted upward above the cassette 1. This means that the twenty-five wafers 2 are so positioned as having their front and back sides reversed, above the cassette 1. The vertically moving cylinder 27 causes the chuck 80 to move downward and, the drive section 81 closes it, with the result that all of the twenty-five wafers are gripped in the chuck 80.

Next, the chuck 80 is moved upward by the vertically moving cylinder 27, and the rotary actuator 17 of the clamp transferring section 400 operates to transfer the clamp section 300 directly above the expand section 500. On the other hand, the rotary actuator 15 of the expand section 500 operates to raise the first and second wafer retaining plates 18 and 19 to the uppermost portion. As shown in FIG. 8, the grooves 18a and 18b, in the upper end of the wafer retaining plates 18, and the grooves 19a and 19b in the upper end of the wafer retaining plates 19 are all arranged at the same pitch, P3, as the grooves 82a and 83a in the chuck 80.

The vertically moving cylinder of the clamp transferring section 400 causes the chuck 80 to move downward and the drive section 81 opens it, so that the the twenty-five wafers 2 are retained in the wafer retaining plates 18 and 19 of the expand section 500. The chuck 80 is moved upward by the clamp transferring section 400 and is returned directly above the cassette table 30. Then, the rotary actuator 15 of the expand section 500 operates to move downward the wafer retaining plates 18 and 19. Here, the bearings 22 which correspond to each of the wafer retaining plates 18 and 19 slide along the guide slots 6a and 7a of the plate cams 6 and 7, respectively. This allows the distance between the wafer retaining plates 18 and 19 to widen gradually, as they move downward. When the wafer retaining plates 18 and 19 have descended to the lowermost portion, as shown in FIG. 9, the distance, P4, between the groove 18b of the first wafer retaining plates 18 and the groove 19a of the adjacent second retaining plates 19 is twice the initial pitch of P3.

In this way, the twenty-five wafers 2 are placed such that their front and back sides are reversed alternatingly at a short pitch of P3 and a large pitch of P4. The wafers 2, having their back surfaces facing each other, are placed at a pitch of P3 and those having their front surfaces facing each other are placed at a pitch of P4.

Figure 10:
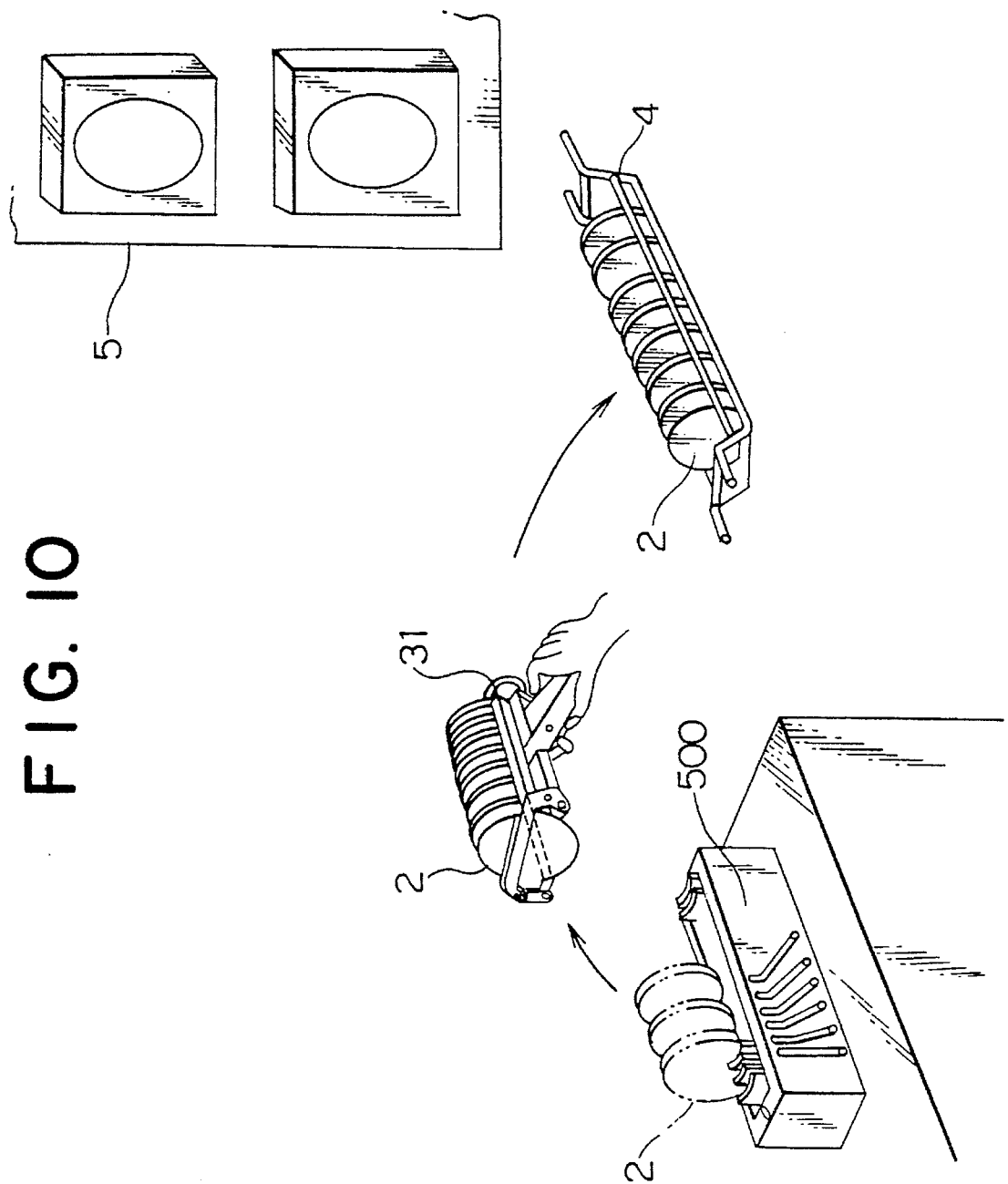
FIG. 10 illustrates the steps taken to coat the wafers, aligned by the wafer aligning apparatus of the embodiment, by the use of a film forming apparatus.

The twenty-five wafers 2, as shown in FIG. 10, are all moved at the same time from the expand section 500 onto the aligning boat 4 using a transfer jig 31. The transfer jig 31 and the aligning boat 4 have grooves spaced at a pitch equal to that at which the wafers 2 are aligned, so that the twenty-five wafers 2 may be tranferred without changing the alignment pitch.

Next, the aligning boat 4 is transported into the film forming device 5 where the wafers 2 are brought into contact with a reacting gas at a high temperature, thereby forming a film thereon. Here since the wafers 2 whose front surfaces face each other are aligned at a large pitch of P4 on the aligning boat 4, the reacting gas flows smoothly on the surfaces of each of the wafers 2, which makes possible the formation of a uniform film. In addition, since the wafers 2, whose back surfaces are facing each other are aligned at a small pitch of P3, the overall length of the aligning boat 4 for loading the twenty-five wafers 2 may be shortened, so that a plurality of the aligning boats 4 may be sent into the film forming device 5 to process a plurality of the wafers 2 simultaneously.

After the film is formed on the wafers 2, the aligning boat 4 is taken out of the film forming device 5, and the wafers 2 are transferred onto the wafer retaining plates 18 and 19 of the expand section 500 by means of the transfer jig 31. Then, after the exact operations as described above have been performed in the reverse order, the wafers 2 are returned into the cassette 1. That is, moving the wafer retaining plates 18 and 19 upwards results in an aligning pitch of P3 between each of the wafers 2. Further, the wafers 2 are clamped by the clamp section 300, and transferred from the expand section 500 to the area above the cassette 1 by means of the clamp transferring section 400. Here, the wafers 2 are transferred onto the first and second thrust-up plates 10 and 12 of the wafer thrust-up section 200. Afterwards, while the odd-numbered wafers 2 alone descend and are accommodated in the cassette 1, the even-numbered wafers 2 are gripped in the chuck 80. While gripped in the chuck 80, the even-numbered wafers 2 move upward and rotate 180 degrees around the vertical axis, and are held once again on the second thrust-up plates 12. The second thrust-up plates 12 move downward so that the even-numbered wafers 2 are accommodated in the cassette 1. In this way, the twenty-five wafers 2 are put back into the cassette 1 such that they face the same direction at the same pitch.

Figure 11:
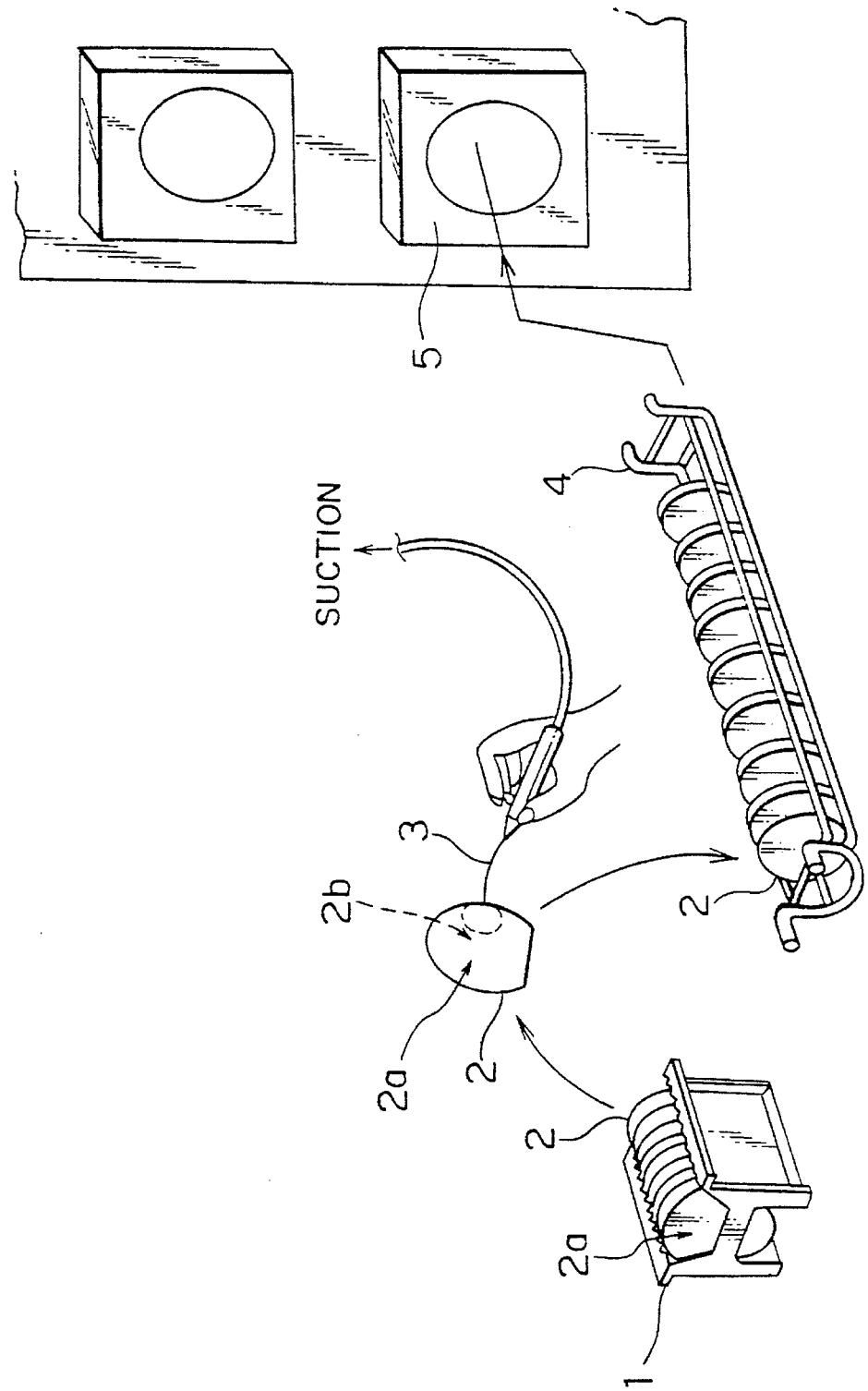
FIG. 11 illustrates a conventional method of aligning wafers.
Figure 12:
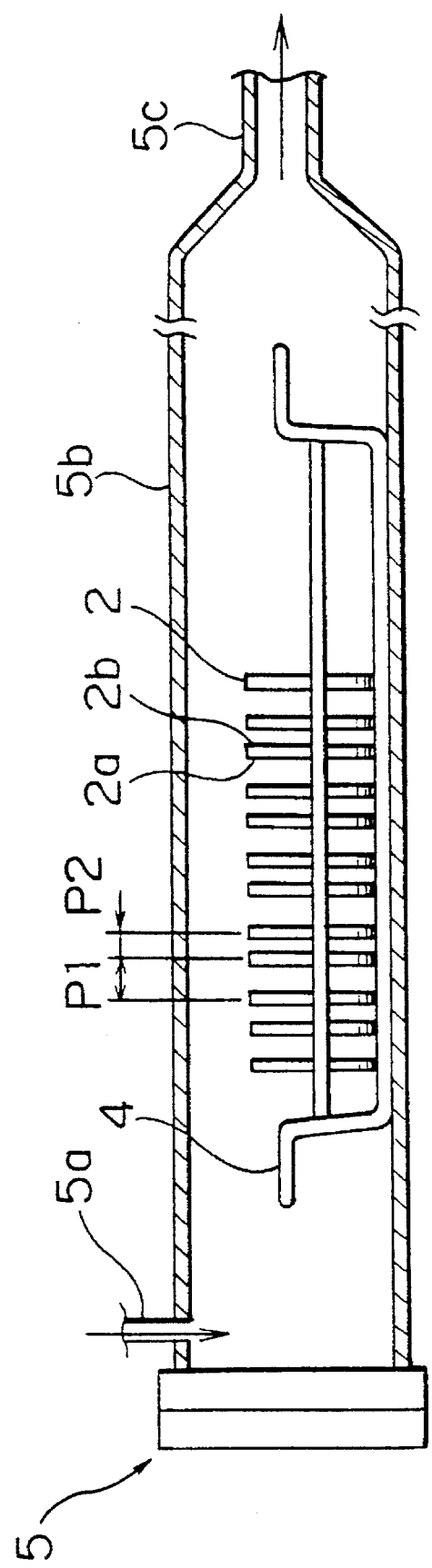
FIG. 12 is a cross section of the interior of a film forming apparatus.

This wafer aligning apparatus allows the wafers to be transferred in a short period of time, without scratching the wafer surfaces or introducing foreign substances thereto. For example, the conventional method, illustrated in FIG. 11, requires one minute to transfer the twenty-five wafers, but this wafer aligning apparatus requires only 32 seconds to do the same job.

Although in the above-described embodiment, the wafers 2 are arranged at a pitch of P3 (=4.76 mm) and a pitch of P4 (=9.52 mm) based on the expand section 500, the present invention is not limited thereto. The pitch may be easily changed by using a plate cam with slots of a different shape instead of the plate cams 6 and 7.

The invention is not limited to in its application to a 5-inch wafer alignment. It may be equally applied, for example, to align wafers having a diameter of 4 inches, 6 inches, and the like.

In the embodiment described, the wafers 2 are aligned so that their front and back surfaces alternatingly face each other, but depending on the processing, the pitch alone may be increased, with the wafers 2 facing the same direction.

The aligning apparatus of the invention may also be applied to transfer the wafers from a cassette made of a certain material, such as Teflon, to one made of a different material, such as plastic.

What is claimed is:

1. A wafer aligning apparatus comprising:

a plurality of wafer retaining plates, each retaining plate having a plurality of distinct retaining portions for retaining a plurality of wafers spaced from each other in a noncontacting relationship;

guide means for guiding said wafer retaining plates; and retaining plate transferring means for transferring said plurality of wafer retaining plates along said guide means wherein, when said plurality of wafer retaining plates are at a first end of said guide means, said plates are aligned at a first pitch, and, when said plurality of wafer retaining plates are at a second end of said guide means, said plates are aligned at a second pitch different from the first pitch.

2. The wafer aligning apparatus according to claim 1 wherein each of said wafer retaining plates has a pair of grooves spaced by the first pitch for retaining a pair of wafers.

3. The wafer aligning apparatus according to claim 1 wherein said guide means includes a plate cam having a plurality of guide slots in correspondence with said plurality of wafer retaining plates and a plurality of guide bearings, each guide bearing being slidably fitted into a corresponding guide slot and being disposed on a corresponding wafer retaining plate.

4. The wafer aligning apparatus according to claim 3 including retaining plate moving means having a rotary actuator, a rotating shaft rotated by said rotary actuator, arms fixed to said rotating shaft, a vertically moving plate linked to the front ends of said arms and moving vertically in response to rotation of said rotating shaft, and a plurality of sliding bearings, each sliding bearing being slidably mounted on said vertically moving plate parallel to said rotating shaft and supporting a corresponding wafer retaining plate.

5. The wafer aligning apparatus according to claim 3 wherein said plate cam is replaceable.

6. The wafer aligning apparatus according to claim 1 comprising:

first thrust-up means for simultaneously thrusting upward, above a cassette accommodating a plurality of wafers, a first group of the wafers;

second thrust-up means for simultaneously thrusting upward, above the cassette, a second group of the wafers interleaved in the cassette with the first group of wafers;

clamp means for gripping the plurality of wafers thrust upward by said first and second thrust-up means; and clamp transferring means for transferring said clamp means above said plurality of wafer retaining plates, said plurality of wafer retaining plates receiving a plurality of wafers from said clamp means.

7. The wafer aligning apparatus according to claim 6 wherein each of said first and second thrust-up means includes a thrust-up body plate, a thrust-up block at an upper end of said thrust-up body plate and having therein a groove for retaining a wafer, and a lock lever for removably attaching said thrust-up block to the upper end of said thrust-up body plate.

8. The wafer aligning apparatus according to claim 6 wherein said clamp transferring means includes vertically moving means for vertically moving said clamp means, rotating means for rotating said clamp means around a vertical axis, and horizontal transferring means for horizontally moving said clamp means.

9. A wafer aligning apparatus comprising:

a plurality of wafer retaining plates, each retaining plate for supporting a plurality of wafers spaced apart at a uniform first pitch;

a guide supporting the wafer retaining plates for movement in a direction parallel to the wafers supported by the wafer retaining plates between a first position and a second position while changing the spacing between the wafer retaining plates, the pitch between two wafers on adjoining wafer retaining plates being the first pitch when the wafer retaining plates are in the first position and being a second pitch, different from the first pitch, when the wafer retaining plates are in the second position; and a drive mechanism for moving the wafer retaining plates between the first and second positions.

10. The apparatus according to claim 9 wherein the guide maintains the wafer retaining plates substantially parallel with each other as the wafer retaining plates move between the first and second positions.

11. The apparatus according to claim 9 wherein the first position of at least a portion of the wafer retaining plates is horizontally displaced from the second position.

12. The apparatus according to claim 9 wherein the guide includes a plurality of slots, and each wafer retaining plate is slidably supported by one of the slots for movement between the first and second positions.

13. The apparatus according to claim 12 wherein the guide includes first and second opposing sides, a first group of the plurality of slots being located in the first side and a second group of the plurality of slots being located in the second side, the first and second groups of slots supporting different groups of the wafer retaining plates.

14. The apparatus according to claim 12 wherein each slot has a first end region and a second end region, the second end region being spaced from and extending parallel to the first end region.

15. The apparatus according to claim 14 wherein the plurality of slots includes a connecting portion connected between and sloped with respect to the first and second end regions.

16. The apparatus according to claim 9 wherein the wafer retaining plates abut each other in the first position.

17. The apparatus according to claim 9 wherein each wafer retaining plate supports a plurality of wafers from beneath the wafers.

18. The apparatus according to claim 9 wherein each wafer retaining plate includes two wafer-supporting slots disposed at the first pitch and each slot is sized to receive a single wafer.

19. The apparatus according to claim 9 wherein the first pitch is approximately 4.76 mm.

20. The apparatus according to claim 9 including a transfer mechanism for transferring a plurality of wafers uniformly spaced at the first pitch between a wafer cassette and the wafer retaining plates.

* * * * *